United States Patent [19]

Grudkowski et al.

[11] 4,345,176
[45] Aug. 17, 1982

[54] TEMPERATURE COMPENSATED GALLIUM ARSENIDE SURFACE ACOUSTIC WAVE DEVICES

[75] Inventors: Thomas W. Grudkowski, Glastonbury; Meyer Gilden, West Hartford, both of Conn.

[73] Assignee: United Technologies Corporation, Hartford, Conn.

[21] Appl. No.: 203,178

[22] Filed: Nov. 3, 1980

[51] Int. Cl.³ .......................................... H01L 41/08
[52] U.S. Cl. ........................... 310/313 A; 310/313 B; 310/313 D; 310/346; 333/195
[58] Field of Search ............... 310/313 R, 346, 313 A, 310/313 B, 313 C, 313 D; 333/151, 153, 155, 194, 195

[56] References Cited

U.S. PATENT DOCUMENTS

| | | | |
|---|---|---|---|
| 3,795,879 | 3/1974 | Whitehouse et al. | 333/195 |
| 3,965,444 | 6/1976 | Willingham et al. | 310/346 X |
| 4,223,286 | 9/1980 | Ono et al. | 310/313 A X |
| 4,233,573 | 11/1980 | Grudkowski | 333/195 X |

*Primary Examiner*—Mark O. Budd
*Attorney, Agent, or Firm*—M. P. Williams

[57] ABSTRACT

Temperature compensation is provided to a surface acoustic wave device including acoustoelectric transducers (12, 14) formed on a surface of a gallium arsenide substrate (10), by a composite layer including silicon dioxide (18, 26) and a mass loading metal (20, 24), which may be gold, titanium and gold, or other metals having Rayleigh wave velocities lower than that of gallium arsenide, such as silver and platinum.

4 Claims, 3 Drawing Figures

TEMPERATURE COMPENSATED GALLIUM ARSENIDE SURFACE ACOUSTIC WAVE DEVICES

The Government has rights in this invention pursuant to Contract No. DAAK20-79-C-0263 awarded by the Department of the Army.

DESCRIPTION

1. Technical Field

This invention relates to surface acoustic wave devices formed on gallium arsenide substrates, and more particularly to temperature compensation thereof.

2. Background Art

There are a variety of applications in which the utilization of surface acoustic waves is well known. These include delay lines, oscillators, signal processors (such as convolvers, correlators and the like) and strain related phenomenon transducers, such as for measuring force, pressure, temperature and the like. A recent advancement in the art employs gallium arsenide as the surface acoustic wave substrate because the inherent semiconducting properties of gallium arsenide (along with its piezoelectric properties) permit fabrication of monolithic circuit/device combinations, in which ordinary semiconductor fabrication techniques can be employed. Although the piezoelectric coupling coefficient of a pure Rayleigh wave propagating in a (110) direction on a (001) substrate (or equivalents) is only 20%–40% lower than that of ST-cut quartz, gallium arsenide has a relatively large linear temperature coefficient of phase delay (on the order of +52 ppm/°C.) which requires extraordinary, precise temperature control in many applications. Of course, temperature controlled environments, temperature sensing with commensurate correction, and other external means of temperature compensation are well known. However, the most useful and direct means of temperature compensation for surface acoustic wave devices involves the use of passive, thin film overlays to provide a total structure which has a suitably low temperature coefficient of phase delay. For instance, a film of silicon dioxide has been proposed to provide temperature compensation for silicon substrates by Cambon, G., et al, "Design of a Temperature Stable Surface Acoustic Wave Device on Silicon", Electronics Letters, 1978, Vol. 17, pp 535–538. In the case of silicon, application of a film of silicon dioxide causes a reduction in the velocity of the Rayleigh wave so that the propensity for "leaky wave" coupling is reduced, rather than enhanced with the silicon dioxide film.

The application of a film of silicon dioxide on gallium arsenide for temperature compensation, on the other hand, is not directly useful. This is because the velocity of the Rayleigh wave increases with the thickness of the silicon dioxide, until the velocity of the shear wave of the gallium arsenide substrate is approached and surface confinement of the wave is degraded, as the wave degenerates into a leaky wave. Since only a small portion of the wave is contained within the silicon dioxide layer, as a result of the reduced surface confinement, its temperature compensating effect is not available. The critical thickness of the silicon dioxide layer which results in a Rayleigh wave velocity about equal to the substrate shear wave is approximately 4/10 of the acoustic wavelength, such as about 6 to 7 microns at an RF frequency of 180 MHz. For greater silicon dioxide thickness, still less of the wave is confined within the silicon dioxide layer because of energy leakage into the substrate so that the wave assumes the temperature characteristics of the gallium arsenide substrate. Therefore, the initial temperature coefficient of phase delay with zero silicon dioxide thickness of about +52 ppm/°C. reduces to a value of about +21 ppm/°C. with 6 or 7 microns of silicon dioxide at a 180 MHz RF frequency, and increases to about +50 ppm/°C. at 12 microns of silicon dioxide (180 MHz). It never reaches a zero or negative temperature coefficient of phase delay. Therefore, the teachings of the prior art relative to utilization of thin silicon dioxide films for temperature compensation of surface acoustic wave substrates are not useful with gallium arsenide.

Silicon dioxide films have been used as overlays on lithium niobate and lithium tantalate SAW delay line substrates, as reported by Parker, T. E., et al: "$SiO_2$ Film Overlays For Temperature Stable Surface Acoustic Wave Devices", Applied Physics Letters, Vol. 26, No. 3, 1 February 1975, pp 75–77. As reported therein, the application of silicon dioxide layer with what should be a proper thickness for temperature compensation results in "leaky wave" propagation due to strong coupling of acoustic energy with the shear mode wave because the SAW velocity has become close to the shear mode velocity. Parker et al overcome that problem by using a very thick film so that the wave is only on the surface of the $SiO_2$ layer. Thus by dividing the total delay path length into two sections, one with a thick layer and one with a thin or no layer, the negative coefficient of the thick layer can be made to cancel the positive coefficient of the substrate. This approach is only suitable for long delay paths, and is detrimental to making reliable devices and to low loss transitions into and out of the thick layer region. This two path approach is definitely not suitable, for example, for the grating of SAW resonators, where each grating period of a half wavelength must be reproduced identically, or for multi-tap signal processors.

DISCLOSURE OF INVENTION

Objects of the invention include temperature compensation of gallium arsenide surface acoustic wave substrates, using surface confinement techniques to avoid energy loss into the substrate.

According to the present invention, a gallium arsenide surface acoustic wave substrate is temperature compensated by means of a composite film disposed on the wave-propagating surface thereof, the composite film including silicon dioxide and a metal (such as gold) which mass loads the substrate, thereby reducing the velocity of the Rayleigh wave to offset the increase Rayleigh velocity effect of the silicon dioxide portion of the composite layer.

According to the invention, the composite layer may employ silicon dioxide on the gallium arsenide surface, with a metal overlaying the silicon dioxide; or, the metal may be applied directly to the wave propagation surface of the gallium arsenide, as a solid sheet or as electrodes, and Silicon dioxide overlaid the metal. Or, several layers in various orders may be employed.

The invention provides a relatively simple way of providing temperature compensation to piezoelectric and semiconductive surface acoustic wave devices, employing well known microelectronic processing techniques. The invention may be practiced using processes and techniques which are well known in the art, in the light of the teachings which follow hereinafter.

Other objects, features and advantages of the present invention will become more apparent in the light of the following detailed description of exemplary embodiments thereof, as illustrated in the accompanying drawings.

BEST MODE FOR CARRYING OUT THE INVENTION

Figure 1:
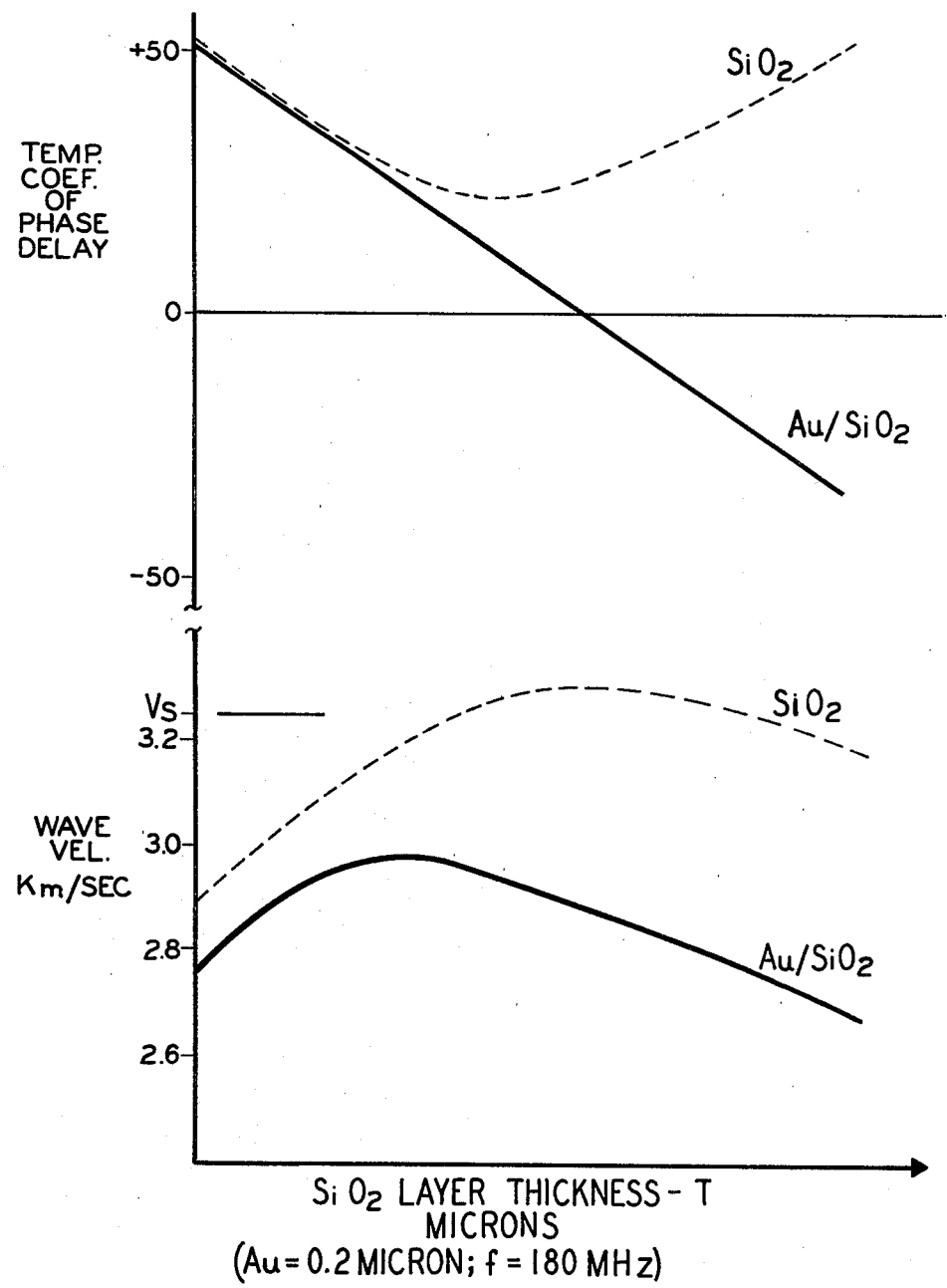
FIG. 1 is a composite diagram of temperature coefficient of phase delay and of wave velocity, both as a function of silicon dioxide layer thickness for silicon dioxide alone as well as for a composite layer in accordance with the invention.

Referring now to FIG. 1, the dash lines indicate the behavior of a gallium arsenide SAW substrate having a silicon dioxide layer thereon. The behavior is plotted for both temperature coefficient of phase delay and wave velocity of the Rayleigh wave as a function of different thicknesses of the layer. As described briefly hereinbefore, it is seen that the best possible compensation leaves the composite substrates with a temperature coefficient of phase delay in excess of $+20$ ppm/°C. while at the same time exceeding the shear wave velocity of gallium arsenide (about 3240 meters per second) for thicknesses on the order of 5 or 6 microns at an RF frequency of 180 MHz ($16\mu$ wavelength). And, even though further increases of the thickness in the silicon dioxide layer reduce the velocity to one which may be acceptable (below 3200 meters per second), at this thickness ($12\frac{1}{2}$ microns) the temperature compensation effect is nil, the composite structure having a temperature coefficient of phase delay of close to $+50$ ppm/°C. (essentially the same as gallium arsenide without any silicon dioxide layer). Therefore, it is clear that silicon dioxide is not useful for temperature compensation of gallium arsenide SAW substrates.

According to the invention, a composite layer not only adds temperature compensation but also mass loads the composite substrate. The composite layer includes both gold and silicon dioxide. The example herein includes a thin titanium layer (several hundred Angstroms) to improve adhesion between the silicon dioxide and gold layers. This provides good temperature compensation without creating a propensity for leaky waves. In FIG. 1, the solid lines show that the temperature coefficient of phase delay for the composite layered gallium arsenide substrate, which includes a mass loading metal, not only can reach zero, but can become negative. And, the maximum velocity of the Rayleigh wave is well below the shear wave velocity, being raised only from about 2880 meters per second to about 2970 meters per second before increased thicknesses cause decrease in the wave. Thus, a composite layer including both a silicon dioxide temperature compensation layer of about $7\frac{1}{2}$ microns thickness and mass loading of a suitable metal can provide (in the example herein) a zero temperature coefficient of phase delay at a wave velocity which is actually less than that for a gallium arsenide substrate without any superficial layers thereon. And, because the temperature coefficient of phase delay can be adjusted, with thick enough silicon dioxide, to be a negative coefficient, it is only necessary to provide a relatively thick layer (8 or 12 microns, at $f=180$ MHz) across some portion of a substrate surface so as to provide zero compensation for the substrate as a whole, if desired.

Figure 2:
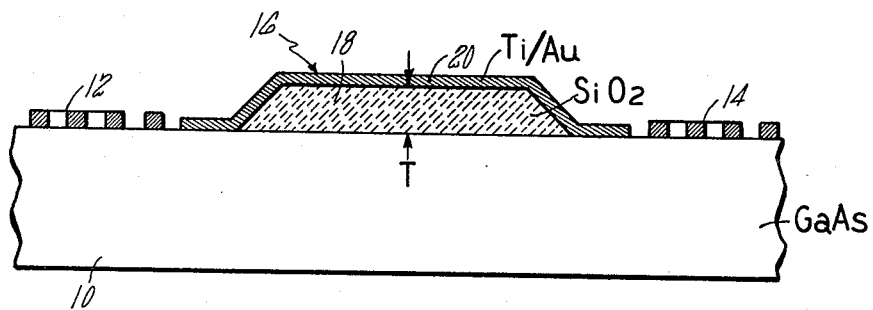
FIG. 2 is a simple, sectioned side elevation view of one embodiment of the invention.

Referring now to FIG. 2, a semi-insulating gallium arsenide surface acoustic wave substrate 10 has acoustoelectric transducers 12, 14 formed thereon. These may comprise the well known interdigital transducers which may consist of about 0.15 microns of chromium and aluminum sequentially deposited on the surface of the gallium arsenide substrate. In accordance with the invention, a composite temperature compensating layer 16 is disposed on the wave surface of the substrate 10 and includes a layer 18 of amorphous silicon dioxide and a layer 20 of a metal having a suitable mass loading relationship with respect to the gallium arsenide substrate. Mass loading occurs by utilization of a metal which has a lower wave velocity than that for the gallium arsenide substrate, which may be semi-insulating or semiconducting; if semiconducting, the transducers can be reverse-biased Schottky barriers, as is known. In the example, the amorphous silicon dioxide is RF sputtered at a suitable substrate temperature of on the order of 250° C. In this example, reference to FIG. 1 would indicate that the desired layer thickness (T, in FIG. 1) is on the order of 6 microns or more for $f=180$ MHz ($T/\lambda \approx 0.4$), depending on the fraction of the distance between the transducers 12, 14 which includes the composite layer 16. For instance, if only a small portion of the distance is covered with the composite layer 16, then the silicon dioxide thickness may be greater to overcompensate for that portion, so that the uncompensated portions will average therewith. In the example of FIG. 2, a thin titanium interface layer (not shown), on the order of 0.03 microns is sputtered onto the surface of the silicon dioxide for enhanced adhesion, and then a gold layer of about 0.2 microns is RF sputtered on top of the titanium. The results illustrated in FIG. 1 are obtainable when the fraction of the total interaction region (distance between the transducers 12, 14) which is covered with a composite layer is on the order of 0.7–0.9. Of course, 100% coverage may not be practical in some cases.

Figure 3:
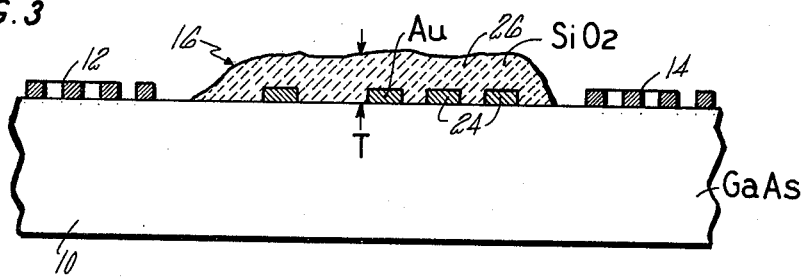
FIG. 3 is a simple, sectioned side elevation view of a second embodiment of the invention.

The invention may also be practiced by having layers in different orders. For instance, in signal processing SAW devices (such as those having taps dispersed along the interaction region) it is impractical to have the temperature compensation at any one point, even if that one point can be overcompensated. This results from the fact that the temperature compensation must be equivalent for all of the surface between and among all of the taps. In FIG. 3 is illustrated (in a very general fashion) an alternative method of practicing the invention which provides the mass loading metal directly on the surface of the substrate, and overlaying it with silicon dioxide. In such a case, the thickness of the metal may be greater than that in the embodiment of FIG. 1, although the surface expanse covered thereby may be less of the total interaction region than in the embodiment of FIG. 2. In FIG. 3, the metal segments 24 are merely representative of taps which may be dispersed along the interaction region and the silicon dioxide 26 is simply laid over the taps. The invention may also be utilized in surface acoustic wave resonators, wherein the reflector elements may be formed of a suitable mass loading metal and covered with amorphous silicon dioxide, in a manner illustrated generally by the elements 24, 26 in FIG. 3.

In the examples herein, gold, and gold plus titanium (to provide better bonding) are used as examples. However, platinum, silver and other high-density metals may be utilized, all that is required is to choose metals which have a lower wave velocity than that of the semi-insulating gallium arsenide in order to mass load the substrate, thereby to permit use of silicon dioxide without increasing the velocity of the Rayleigh wave to a point near the shear velocity of gallium arsenide, at which point leaky wave behavior commences.

The invention may be practiced utilizing composite layers involving a variety of different metals, and with various layers in various orders. For instance, it is possible to apply another layer of metal over the silicon dioxide in the embodiment of FIG. 3, if found to be advantageous in any given implementation of the invention.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

We claim:

1. A temperature compensated surface acoustic wave device comprising a semi-insulating gallium arsenide substrate and at least one acoustoelectric transducer disposed on a surface of said substrate,
characterized by:
a composite mass loading and temperature compensating layer disposed on said surface, said layer including silicon dioxide and a metal having a Rayleigh wave velocity which is lower than the Rayleigh wave velocity of gallium arsenide.

2. A surface acoustic wave device according to claim 1 wherein said composite layer includes a metal selected from the group including gold, silver and tungsten.

3. A surface acoustic wave device according to claim 2 wherein said composite layer includes gold.

4. A surface acoustic wave device according to claim 1 wherein said composite layer includes a layer of silicon dioxide deposited on said surface of said gallium arsenide substrate, a layer of titanium deposited over said silicon dioxide, and a layer of gold deposited over said layer of titanium.

* * * * *